United States Patent

Brown et al.

Patent Number: 5,858,537
Date of Patent: Jan. 12, 1999

[54] COMPLIANT ATTACHMENT

[75] Inventors: Michael A. Brown, Columbia; Nelson Hyman, Randallstown, both of Md.

[73] Assignee: The United States of America as represented by the Secretary of the Navy, Washington, D.C.

[21] Appl. No.: 656,531

[22] Filed: May 31, 1996

[51] Int. Cl.$^6$ ....................................................... B32B 9/00

[52] U.S. Cl. ........................ 428/408; 428/36.3; 428/212; 428/338; 428/367; 428/370; 428/372; 428/378; 428/389; 428/397; 428/400; 428/607; 428/614; 228/122.1; 228/123.1; 165/164; 165/170; 165/180; 165/185; 156/167

[58] Field of Search .................................. 428/36.3, 225, 428/375, 372, 379, 370, 607, 614, 378, 397, 400, 212, 338, 367, 389, 408, 457, 368, 374, 401; 165/170, 164, 180, 185; 264/105; 156/167, 169; 228/122.1, 123.1

[56] References Cited

U.S. PATENT DOCUMENTS 5,389,400  2/1995  Ting et al. ................................. 427/249
5,424,916  6/1995  Martin ....................................... 361/698
5,542,471  8/1996  Dickinson ................................. 165/170

*Primary Examiner*—William Krynski
*Assistant Examiner*—Abraham Bahta
*Attorney, Agent, or Firm*—Thomas McDonnell; George Kap

[57] ABSTRACT

In one embodiment the article includes a metal support having a top surface, a well provided in the top surface of the support and extends downwardly into the support, the well is defined by a floor at the bottom thereof, second fibers anchored in spaced relationship in the floor of the well and extending therefrom to a level short of the top surface of the support, a diamond substrate disposed over and covering the well, the substrate is larger than the well and has portions thereof in direct or indirect contact with the support, a metal layer adhering to the substrate, first fibers anchored in spaced relationship in the metal layer and extending therefrom into the well to a level short of said well floor, the substrate being smaller than the support. The method of using the article includes the steps of subjecting the article to thermal cycling, conveying thermal energy from the substrate to the first fibers, conveying thermal energy from the first fibers to the second fibers, conveying thermal energy form the second fibers to the support, and moving the support and the substrate relative to each other without fracturing the substrate in response to thermal cycling of the article.

18 Claims, 2 Drawing Sheets

COMPLIANT ATTACHMENT

FIELD OF INVENTION

This invention pertains to compliantly joining diamond to a metal or diamond to a ceramic.

BACKGROUND OF INVENTION

Electronic circuits are frequently made by plating copper on an electrically insulating substrate made of a material, such as silicon or gallium arsenide. If the circuit contains elements that generate heat, the heat must be removed or the electronic components will deteriorate or be destroyed. In terrestrial applications, removal of heat can be done by blowing air over the circuit but in space applications, heat is removed only by conduction down through the substrate. The substrate must, therefore, be attached by solder or braze to a metal heat sink or support so that there is a good thermal bond between the heat sink and the substrate. At the same time, the thermal expansion rate of the substrate must approximate that of the heat sink so that the bond between the substrate and the heat sink will not fracture under thermal cycling. Unfortunately, the materials that presently qualify for use as a substrate are ceramics, such as silicon and gallium arsenide, that have a very poor thermal conductance. This causes the electronic devices on the substrate to operate at elevated temperatures which limit the life of the circuit.

Diamond, such as made by chemical vapor deposition (CVD), has been proposed as a superior substrate for thermally stressed electronic circuits and as a heat spreader. Diamond has about five times the thermal conductivity of pure copper and diamond is an electrical insulator. Diamond, as well as ceramics, can also be plated with a metal so that circuits can be created on a large, flat diamond or ceramic sheet. However, the large differential in thermal expansion rates between diamond and metals or ceramics limits the useful size of the diamond substrate to about one square centimeter. Larger diamond substrates tend to fracture due to stresses induced by thermal cycling.

OBJECTS AND SUMMARY OF INVENTION

It is an object of this invention to secure fibers in a diamond or a ceramic substrate by providing a softer layer of a metal on the substrate and anchoring the fibers in the softer layer in order to effectively transfer heat.

Another object of this invention is to compliantly join diamond to a metal support by means of highly thermally conducting fibers which can efficiently transfer heat from diamond to the support and to operate the article at a lower temperature, the article comprising diamond substrate compliantly joined to the support which allows for relative movement due to thermal cycling.

Another object of this invention is to join diamond to a metal by means of fibers to allow expansion and contraction between diamond and the metal during thermal cycling without fracturing diamond, thus prolonging life of the article comprising diamond compliantly joined to the metal.

Another object of this invention is to compliantly join a ceramic to a diamond heat spreader by means of fibers to allow for expansion and contraction between the ceramic and diamond during thermal cycling without fracturing the ceramic or the diamond.

These and other objects of this invention can be attained by joining diamond to a metal support by means of thermally conducting fibers extending from diamond and the support and cooperating in an interdigitating manner.

DETAILED DESCRIPTION OF INVENTION

This invention pertains to a diamond or a ceramic substrate compliantly or flexibly joined to a support by means of interdigitating fibers extending from the ceramic wafer or the diamond substrate and the support and with an adhesive attaching the structures together. The method of using the article includes the steps of subjecting the article to thermal energy, conveying thermal energy from the substrate to the support through a compliant or flexible joint between the substrate and the support, and moving the support relative to the substrate in response to thermal cycling of the article.

Two principal embodiments represent the invention herein. In the first embodiment of this invention, generally illustrated in FIG. 3, an electronic circuit is disposed on a diamond substrate and the diamond substrate is compliantly joined to a heat sink. The heat from the diamond substrate is transferred to the heat sink by means of the intermingling fibers protruding from the diamond and the heat sink.

Figure 4:
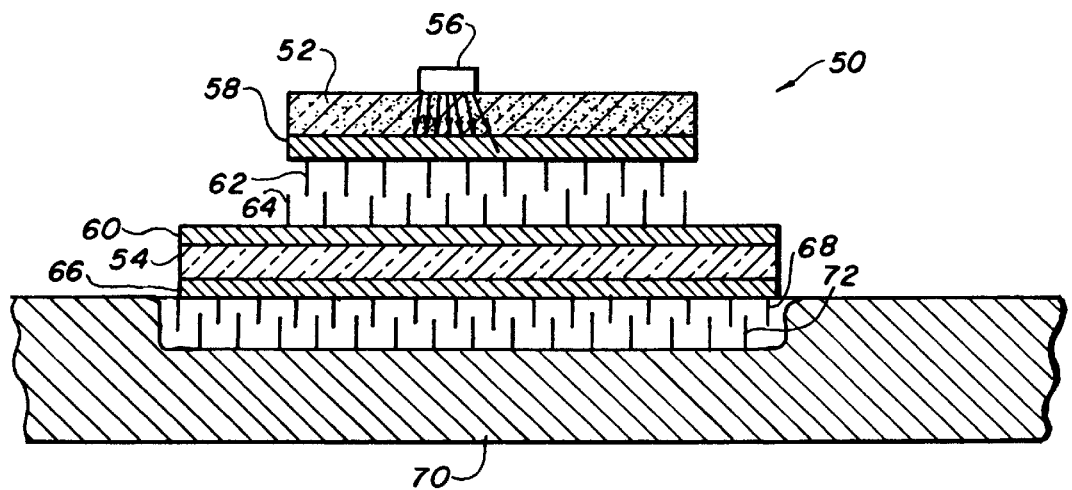
FIG. 4 is a schematic illustration of the second embodiment of this invention wherein an electronic circuit is disposed on a ceramic, the ceramic is compliantly joined to a diamond substrate which acts as a heat spreader, and the diamond substrate is compliantly joined to a heat sink.

In the second embodiment generally illustrated in FIG. 4, an electronic circuit is disposed on a ceramic wafer, and the wafer is compliantly attached to a diamond substrate by means of interdigitating fibers extending from the ceramic wafer and the first surface of the diamond substrate. Since ceramic wafer and diamond are very hard substances and direct fiber flocking thereof cannot be accomplished practically, a metal layer is deposited on these substances to facilitate fiber flocking or anchoring of the fibers in the metal layer. The diamond substrate in the second embodiment is then compliantly attached to a metal heat sink also by fiber flocking the second surface of the diamond substrate, which second surface is on the opposite face from the first surface. Again, since diamond is such a hard substance, a metal layer is provided on the second surface thereof to facilitate anchoring of the fibers onto the second surface thereof. The metal heat sink is soft enough to fiber flock it directly. In this second embodiment, diamond substrate functions as a heat spreader.

Figure 1:
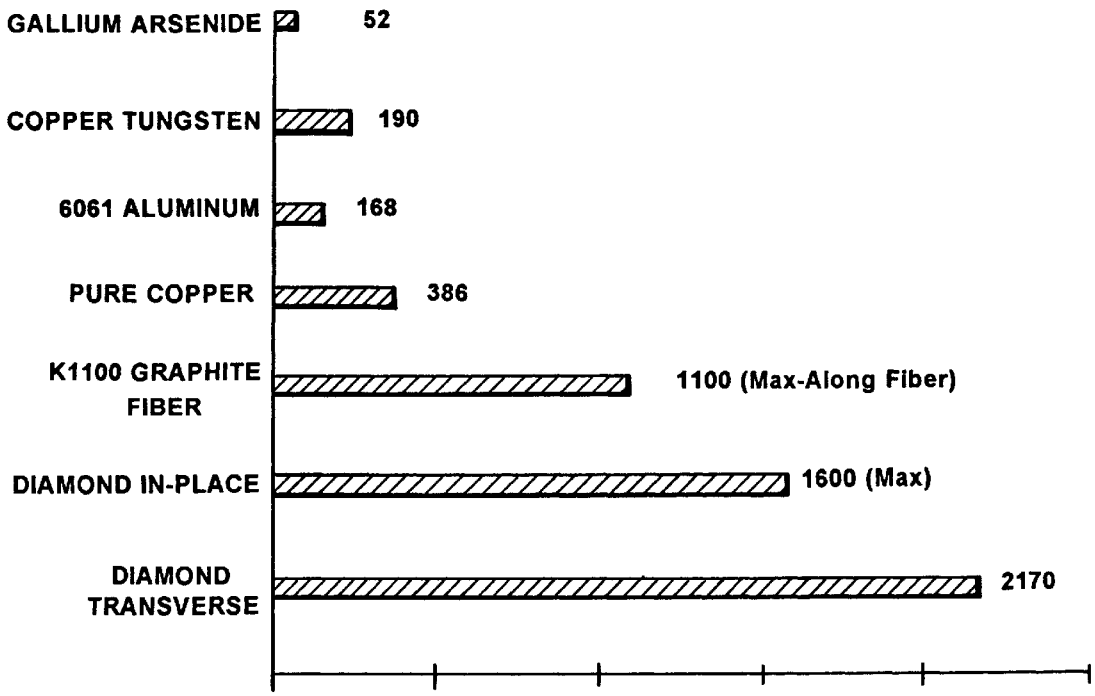
FIG. 1 is a bar graph which shows superior thermal conductivity of diamond and the graphite fibers as compared to gallium arsenide ceramic, copper tungsten, aluminum, and copper.

In an electronic device, the diamond substrate is typically up to about 30 square centimeters and up to about 1 mm in thickness, although more often, it is smaller and thinner. The diamond substrate typically carries an electrical circuit that can generate heat or it can serve as a substrate for an electrical circuit mounted on a ceramic wafer. In either case, a diamond substrate is used since it conducts thermal energy or heat much better than any known substance. For instance, in-plane thermal conductivity of diamond is 1600 watts/meter-Kelvin (w/m-K) as compared to 52 w/m-K for gallium arsenide, 1.4 w/m-K for silicon, 190 w/m-K for copper tungsten, and 168 w/m-K for aluminum. Thermal conductivities of some of the materials of interest are given FIG. 1. Gallium arsenide and silicon are typically used as wafers on which reside one or more heat-generating elctrically conducting circuits. Copper tungsten and aluminum are typically used as heat spreaders or heat sinks, i. e., supports.

The use of a diamond substrate in place of a gallium arsenide wafer in a typical electronic device is preferred since in-plane thermal conductivity of diamond is more than thirty times higher than that of gallium arsenide. In real terms, what this means is that if a diamond substrate is used in place of a gallium arsenide wafer, the heat generating electrical circuit disposed on the diamond substrate would operate at a temperature 10°–50° C. lower. Normal operating temperature of the same electronic circuit mounted on a gallium arsenide wafer is typically between 100° and 200° C. Such a drastic lowering of operating temperature would result in extending the life of such devices and other advantages. Likewise, the use of diamond in place of copper tungsten as heat spreader or support would allow the diamond heat spreader to function more efficiently than copper tungsten heat spreader because in-plane thermal conductivity of diamond is more than eight times that of copper tungsten.

The use herein of the terms "heat spreader" and "heat sink" is noted. Although the function of each is different, the two items are similar in that they perform a similar function and are typically relatively high thermally conducting metals. Copper tungsten has been used as a heat spreader and aluminum has been used as a heat sink because aluminum is lighter than copper tungsten, and although its thermal conductivity is somewhat lower than that of copper tungsten, its specific thermal conductivity is higher than that of copper tungsten. Copper tungsten is preferred as a heat spreader, i. e., placed between a ceramic wafer circuit and an aluminum heat sink, because the ratio of copper to tungsten can be varied so that the coefficient of thermal expansion of copper tungsten equals that of the ceramic. For purposes herein, the term "support" is used to include both "heat sinks" and "heat spreaders" and generally denotes a support to which diamond conveys heat.

In the context of the invention disclosed herein, the diamond substrate is provided with a plurality of fibers or whiskers which extend therefrom. Whiskers are typically shorter than fibers and the term is prevalent in certain applications. The diamond substrate is provided with the protruding fibers by means of fiber flocking, which is commercially used. In fiber flocking, fibers are shot into a target through an aligning means at a speed of less than 5 meters per second under an impressed potential of about 15 kilovolts. The fibers are embedded in the target to a depth depending on the hardness of the target. Since diamond is the hardest substance known, the fibers are not embedded in the diamond target directly but a softer layer is provided on the diamond in which the fibers are embedded. In keeping with the main objective of quickly conveying heat from the diamond substrate, the softer layer should be highly thermally conducting and should be easily secured to the diamond substrate. It has been established that suitable materials for the softer layer are transition metals which can be applied to the diamond substrate by electroplating.

When electroplating a softer layer onto the diamond substrate, the area of the substrate to be plated is typically first covered with about 100 angstrom-layer of titanium by means of sputtering to facilitate adhesion. The substrate is then heated to about 600° C. to form titanium oxide, which is then typically covered by about 100 angstrom-layer of platinum, again by sputtering and again to facilitate adhesion. An electroplating solution is then used to deposit the soft copper on the substrate, using a standard electroplating process. A copper layer can be deposited on the substrate to any depth, although about ¼ mil is sufficient for the flocking process.

The softer layer can be provided on the entire face of the substrate or it can be spaced inwardly of the outer edges of the substrate. Although the softer layer can be disposed between the substrate and the support, the substrate, nevertheless, is considered, for purposes herein, to be in thermal contact with the support.

For purposes herein, thickness of the softer layer should be such as to securely anchor each fiber therein. Since length of the fibers can vary widely, thickness of the softer layer deposited on the substrate is typically 1–400 microns, more typically 10–200 microns.

Diamond substrates with the softer layer of desired thickness are commercially available.

The diamond substrate can be produced by chemical vapor deposition (CVD) of precursor gases. CVD consists of depositing diamond at a low pressure, typically 1–800 torr, and at a moderately high temperature, typically 700°–1200° C., directly from the gas phase. The precursor gases are typically mixtures of hydrogen and methane which are activated, as by passage over an incandescent filament or through a microwave or DC discharge. By appropriate adjustment of conditions, diamond can be preferentially deposited instead of graphite.

CVD diamond differs from that produced by high pressure in that it is polycrystalline rather than course and granular. Because the deposition of CVD diamond occurs from the gas phase, the diamond can be made to conform to shapes and surfaces of arbitrary dimensions, curvature and thickness.

It should be understood that any diamond can be used in the diamond substrate of this invention, be it synthetic or natural diamond.

The support also has a plurality of fibers extending therefrom. Since the support is typically metallic, it is softer than diamond and it is not necessary to provide a softer layer thereon to enable anchoring of the fibers therein. The fibers can be anchored in the support also by means of fiber flocking.

The fibers on the diamond substrate and on the support can be same or different and they can be embedded in the softer layer on the diamond substrate and in the support to the same or different depths. Typically, the fibers suitable herein for application to the diamond substrate or the support are graphite fibers 0.1–20 microns, more typically 0.2–10 microns in diameter, and typically 10–1000 microns, more typically 50–500 microns in length. Any other type of fiber, having thermal conductivity exceeding 500 w/m-K, can be used if it can meet similar requirements. The fibers should be embedded in the softer layer on the diamond substrate and in the support to a depth sufficient to securely anchor the fibers. To meet the objective of secure anchoring, the fibers should be embedded in the softer layer and the support to a depth typically 1–50%, more typically 5–30% of their length, measured from the forward end thereof. For proper conduction of heat from the diamond substrate to the support, density of the fibers on the softer layer and on the support should typically be 10,000 to 2 million fibers/mm², more typically 50,000 to 1 million fibers/mm², and typically about 1–80%, more typically 5–40% of the surface area facing the support should be devoted to fibers. A similar percentage of surface area is devoted to fibers on the support. The fibers are typically circular in cross-section although fibers of any cross-section can be used. Spacing between fibers extending from the same surface should be typically 0.1–10, more typically 1–5 microns, for fibers 1 micron in diameter. In assembled state, spacing between the intermingling fibers should be typically about one-half of the spacing between the fibers extending from the same surface, for fibers 1 micron in diameter.

A well can be provided in the support where the fibers are anchored extending inwardly from the top of the support. Surface area of the well is somewhat smaller than the facing surface area of the diamond substrate and its surface dimensions are also smaller than that of the diamond substrate so that when the diamond substrate is placed directly over the well, the diamond substrate is disposed on the upper surface of the support and completely covers the well. An adhesive can be provided at the edges of the diamond substrate to seal the diamond substrate to the support over the well. Clamps or a frame can be used to accomplish the function of the adhesive. The adhesive, clamps or frame also serve to keep any free fiber or any fiber that breaks confined within the well so that broken or loose fibers do not interfere with operation of the article.

In one embodiment, the assembled article includes a support with a well in its top surface with fibers anchored in the well floor and projecting upwardly to a vertical extent below the upper surface of the support. A diamond substrate is disposed on the support over and covers the well. The diamond substrate has a thin layer of a metal wherein fibers are anchored and extend downwardly into the well between the fibers in the well extending upwardly from the support. The fibers secured in the softer layer extend downwardly into the well to a horizontal level above the floor of the well. An adhesive around periphery of the diamond substrate secures the diamond substrate to the support and prevents any loose fiber from escaping from the well.

In operation, a thermal load imposed on the diamond substrate is conveyed by conduction and radiation via the fibers anchored in the softer layer to the fibers anchored in the support and then finally to the support. Although some of the fibers secured to the diamond substrate contact the fibers anchored in the support,. generally there is no contact between the fibers and the heat is conveyed by radiation between these spaced fibers. Spacing between the center lines of the fibers anchored in the softer layer is typically 0.1 to 5 microns, more typically 0.5 to 5 microns, for a 1-micron diameter fiber covering about 20% of the ceramic, diamond or heat sink. Sufficient number of fibers are provided to obtain the desired transfer of heat. Contact is not required for good heat transfer.

Since the main criterion here is thermal conductivity, the materials should be selected on the basis of their thermal conductivity and other parameters, such as cost. However, in space applicaitons, weight and performance dominate cost.

Figure 2:
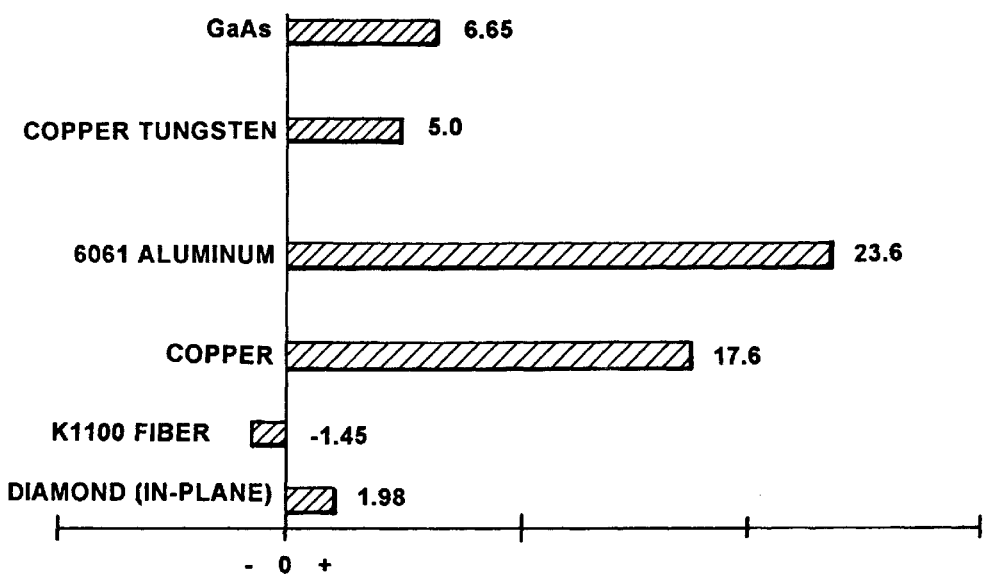
FIG. 2 is a bar graph which gives a comparison of coefficients of thermal expansion of gallium arsenide, copper tungsten, aluminum, copper, graphite fibers, and diamond.

The article described herein has another important advantage in addition to the excellent heat transfer. Any metal used as the support herein will have a coefficient of thermal expansion (CTE) many times that of diamond. For instance, based on FIG. 2, in-plane CTE of diamond is 1.98 whereas CTE of copper tungsten is 5.0, CTE of aluminum is 23.6 and CTE of copper is 17.8. In view of the differences in coefficients of thermal expansion, there will be a wide variation in expansion and contraction during thermal cycling of the article. The compliant joint between the diamond substrate and the support allows for relative movement of the diamond substrate and the support without fracturing the diamond substrate, which is weaker than the support mainly because it is bulkier.

The method of using the article includes the step of subjecting the article to thermal cycling. This takes place when an electronic circuit generates heat when activated. Thermal cycling takes place when the electronic circuit is turned on, during which time the article heats up and expands in response to heat generation, and then turned off, when the heat generation ceases and the article begins to cool and contract. The heat in the diamond substrate is created by an electronic circuit disposed directly on the diamond substrate or on a ceramic wafer which conveys the heat from the circuit to the diamond substrate. Being an excellent heat conductor, the diamond substrate conveys heat through the thin metal layer to the first fibers embedded in the thin metal layer. The heat is then conveyed by the first fibers to the second fibers embedded in the support and then by the second fibers to the metal support within which the second fibers are anchored. The first fibers are disposed in an interdigitating or a generally paralell spaced relationship to the second fibers. There may be some contact between first and second fibers so that some heat may be transferred by conduction between the two. But in general, there is no physical contact so that most of the heat is transferred by radiation through the space between the first and the second fibers. This method also includes the step of moving the support relative to the diamond substrate without rupturing the substrate in response to thermal cycling of the article caused by the disparity in coefficient of thermal expansion of the diamond substrate and the metal support.

The invention having been generally described, the following example is given as a practical embodiment of the invention to demonstrate the practice and advantages thereof. It is understood that the example is given by way of illustration and is not intended to limit in any manner the specification or any claims that follow.

EXAMPLE 1

Figure 3:
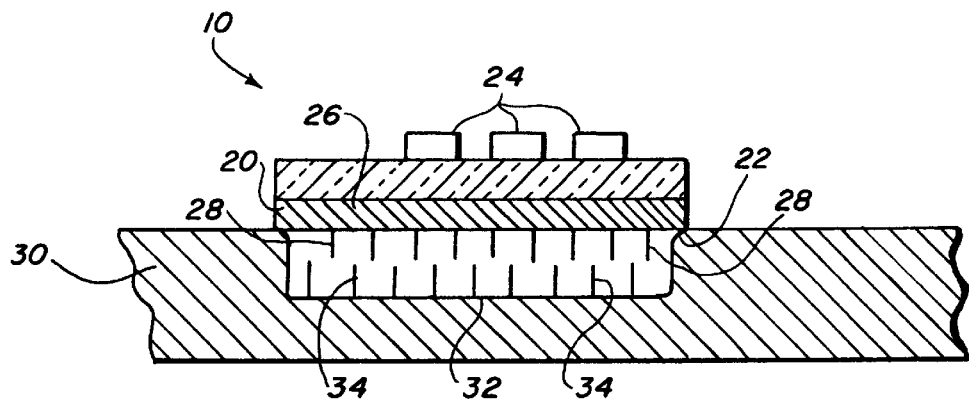
FIG. 3 is a schematic illustration of the first embodiment of the invention wherein a diamond substrate carrying an electronic circuit is compliantly joined to a metal heat sink support by means of fibers projecting from the diamond substrate and the support and a flexible adhesive at the periphery of the diamond substrate.

This example demonstrates the first embodiment of this invention schematically illustrated by FIG. 3.

Electronic device 10 includes diamond substrate 20 attached by adhesive 22 to aluminum heat sink 30. The diamond substrate 20 was polycrystalline CVD diamond measuring 50 mm×50 mm×0.5 mm. A heat-generating electronic circuit comprising copper lines 24 was disposed on top of diamond substrate 20. Adhesive 22 was a flexible adhesive GE RTV31, curable at room temperature, provided between diamond substrate 20 and heat sink 30 at a location corresponding to the edges or periphery of the diamond substrate. Adhesive 22 secured together diamond substrate 20 and heat sink 30.

Provided centrally on the bottom of diamond substrate 20 was a layer of copper 26 of a generally uniform thickness of 20 microns which extended inwardly of the outer edges of the diamond substrate. A plurality of graphite K-1100 fibers 28 were embedded in copper layer 26. Fibers 28 were 1 micron in diameter, 100 microns long and were embedded at a surface density of 20% in the copper layer about 20 microns measured along the length of the fiber from its forward tip. About 250,000 fibers 28 were secured to the copper layer in an area of 1 mm² centrally positioned on the bottom face of diamond substrate 20. Spacing between fibers 28 was 2.8 microns. Fibers 28 extended downwardly, as shown in FIG. 3, for about 100 microns, measured from the bottom face of diamond substrate 20.

Well 32 was provided in heat sink 30 which well had a generally uniform depth of 180 microns. Surface dimensions of well 32 were smaller than surface dimensions of diamond substrate 20 so that when the diamond substrate was placed on the well, the diamond substrate completely covered the well with peripheral edges of the substrate coming in contact with the top of the heat sink. Fibers 28, which extended from the diamond substrate, protruded into well 32, when the diamond substrate was placed over the well, to a depth short of the well floor.

A plurality of graphite fibers 34 were provided in well 32. Fibers 34 were the same as fibers 28, i.e., 1 micron in diameter and 100 microns in length. Fibers 34 were embedded in the well floor of heat sink 30 to a depth of 20 microns. The 250,000 fibers 34 were centrally positioned in well 32 and the spacing between centerlines of fibers 34 was 2.8 microns. Fibers 34 extended upwardly in well 32, as shown in FIG. 3, between fibers 28 to a vertical level below copper layer 26. Thus, as shown in FIG. 3, fibers 28 in copper layer 26 attached to diamond substrate projected into well 32 in spaced relationship to fibers 34 which projected upwardly from the floor of well 32. For a distance of about 30–50 microns, fibers 28 and fibers 34 were side by side in a spaced, interdigitating relationship. The spacing between fibers 28 and 34 was 1.4 microns.

During operation of electronic device 10, the electronic circuit disposed on diamond substrate 20 generated heat which the substrate conveyed to heat sink 30 via fibers 28, 34 and through the contact with the heat sink at the edges of the diamond substrate. The density of the fibers, their numbers and their thermal conductivity is such as to transfer heat from the diamond substrate to the heatsink quickly and efficiently. Furthermore, since the electronic circuit disposed on the diamond substrate is turned on and off many times, electronic device 10 is subjected to thermal cycling during which components of the electronic device expand and contract. Since there is a wide disparity in coefficients of thermal expansion between diamond substrate 20 and aluminum heat sink 30, the diamond substrate and the aluminum expand and contract at different rates but the compliant joint between the diamond substrate and the heat sink allows for such relative movement between the diamond substrate and the heat without shattering the substrate.

EXAMPLE 2

This example demonstrates the second embodiment of this invention schematically illustrated by FIG. 4.

Electronic device 50 includes gallium arsenide ceramic wafer 52 compliantly attached to diamond substrate heat spreader 54 which was polycrystalline CVD diamond. A heat-generating electronic circuit 56 comprising copper was disposed on the wafer. To allow for fiber flocking of the ceramic wafer and the diamond heat spreader, thin layers 58, 60 of copper were provided on surfaces of the ceramic and the diamond to facilitate anchoring of the fibers 62, 64 therein. Fibers 62 were imbedded in the copper layer attached to the ceramic wafer and fibers 64 protruded from the copper layer attached to the diamond heat spreader. A layer of copper 66 was provided on the opposite face of diamond substrate 54 for anchoring fibers 68 therein. Diamond 54 was indirectly disposed on aluminum heat sink 70 from which, at the upper surface thereof, protruded fibers 72.

Fibers 72 were disposed in well 74 provided in heat sink 70. The heat from ceramic wafer 52 was conducted by the compliant joint between ceramic 52 and diamond heat spreader 54 and then to heat sink 70 by the compliant joint between the diamond heat spreader 54 and the heat sink 70. The disparity in coefficients of expansion between ceramic and diamond and between diamond and metal calls for the compliant joints to allow for different rates of expansion during periods of expansion and contraction.

Same or similar adhesive and fibers were used in this example as in the previous example.

Many modifications and variations of the present invention are possible in light of the above teachings. It is, therefore, to be understood that within the scope of the appended claims, the invention may be practiced otherwise than as specifically described.

What is claimed is:

1. An article comprising a diamond substrate and a metal support, said substrate having a plurality of spaced first fibers projecting therefrom, and said support having a plurality of spaced second fibers projecting therefrom, said first and second fibers are disposed generally parallel to each other, side-by-side, and thermal energy transfer between said substrate and said support can take place when said first and said second fibers are positioned in an interdigitating relationship.

2. The article of claim 1 including a metal layer on said substrate in which said first fibers are embedded, said second fibers are embedded in said support, said first and said second fibers have thermal conductivity exceeding 500 w/m-K.

3. The article of claim 2 including a well in said support which well is smaller in surface dimensions than said substrate and said second fibers are disposed in said well floor and project therefrom; and an adhesive bond located at edges of said substrate adhering said substrate and said support and confining said first and second fibers to a space defined by said well.

4. The article of claim 3 wherein said first and said second fibers are graphite fibers and have generally circular cross-sections; said first and said second fibers have a diameter of 0.1–20 microns and are 10–1000 microns long; said first fibers are embedded in said metal layer to a depth of 1–50% of their length and said second fibers are emebedded in said well disposed in said support to a depth of 1–50% of their length; areal density of said first and said second fibers is 10,000–2 million fibers/mm$^2$; spacing between said first fibers is 0.1 to 10 microns, for fibers about 1 micron in diameter; spacing between said second fibers is 0.1 to 10 microns, for fibers about 1 micron in diameter; and area on said substrate where said first fibers are disposed is 1–80%.

5. The article of claim 3 wherein said first and said second fibers are graphite fibers and have generally circular cross-section; said first and said second fibers have a diameter of 0.2–10 microns and are 50–500 microns long; said first fibers are embedded in said metal layer to a depth of 5–30% of their length and said second fibers are embedded in said well disposed in said support to a depth of 5–30% of their length; areal density of said first and second fibers is 50,000–1 million fibers/mm$^2$; spacing between said first fibers is 0.5 to 5 microns; spacing between said second fibers is 1 to 5 microns; and area on said substrate where said first fibers are disposed is 5–40%.

6. The article of claim 5 wherein said metal layer is copper, said metal support is selected from the group consisting of copper/tungsten supports and aluminum supports, said first fibers extend into said well to a distance removed from the floor of said well, said second fibers extend from the floor of said well to a distance below the top surface of said support, and said substrate is disposed on top of said support.

7. The article of claim 6 including a heat-generating electronic circuit disposed on said substrate.

8. The article of claim 6 including a ceramic wafer disposed in a relationship with said substrate for transferring thermal energy between said wafer and said substrate and a heat-generating electronic circuit disposed on said wafer, said wafer is selected from the group consisting of silicon wafers and gallium arsenide wafers.

9. An article comprising a metal support having a top surface, a well provided in the top surface of said support and extends downwardly into said support and is defined by a floor at the bottom thereof, second fibers anchored in spaced relationship in the floor of said well and extending therefrom to a level short of the top surface of said support, a diamond substrate disposed over and covering said well, said substrate having larger surface dimensions than said well and having portions thereof in direct or indirect contact with said support, a metal layer adhering to said substrate, first fibers anchored in spaced relationship in said metal layer and extending therefrom into said well to a level short of said well floor, and said substrate being smaller in bulk and surface dimensions than said support.

10. The article of claim 9 including an adhesive bond disposed between said support and edge portion of said substrate which secures said support and said substrate together and confines any loose fiber to said well, said first and said second fibers have thermal conductivity exceeding 500 w/m-K.

11. The article of claim 10 wherein said first and said second fibers are graphite fibers and have gennerally circular cross-section; said first and said second fibers have a diameter of 0.1–20 microns and are 10–1000 microns long; said first fibers are embedded in said metal layer to a depth of 1–50% of their length and said second fibers are emebedded in said well disposed in said support to a depth of 1–50% of their length; density of said first and said second fibers is 10,000–2 million fibers/mm$^2$; spacing between said first fibers is 0.5 to 1 microns; spacing between said second fibers is 0.5 to 5 microns; and area on said substrate where said first fibers are disposed is 1–80%.

12. The article of claim 9 wherein said first and said second fibers are graphite fibers and have generally circular cross-sections; said first and said second fibers have a diameter of 0.2–10 microns and are 50–500 microns long; said first fibers are embedded in said metal layer to a depth of 5–30% of their length and said second fibers are emebedded in said well disposed in said support to a depth of 5–30% of their length; density of said first and said second fibers is 50,000–1 million fibers/mm$^2$; spacing between said first fibers is 0.5 to 5 microns; spacing between said second fibers is 1 to 5 microns; and area on said substrate where said first fibers are disposed is 5–40%.

13. The article of claim 12 wherein said metal layer is copper layer about 1–400 microns in thickness, and said metal support is selected from the group consisting of copper tungsten supports and aluminium supports.

14. The article of claim 13 including a heat-generating electronic circuit on disposed on said substrate.

15. The article of claim 13 including a ceramic wafer disposed in a relationship with said substrate for transferring thermal energy between said wafer and said substrate and a heat-generating electronic circuit disposed on said wafer, said wafer is selected from the group consisting of silicon wafers and gallium arsenide wafers.

16. A method of using an article comprising steps of
  (a) subjecting an electronic article to thermal cycling which includes the step of imposing thermal energy on the article; the article comprising a diamond substrate provided with first spaced fibers extending from the substrate, and a metal support in thermal communication with the substrate, the support provided with second spaced fibers extending from the support, the first fibers extend generally parallel to the second fibers in spaced, interdigitating relationship.
  (b) conveying thermal energy from the diamond substrate to the first fibers,
  (c) conveying thermal energy from the first fibers to the second fibers,
  (d) conveying thermal energy from the second fibers to the support, and
  (e) moving the support and the substrate relative to each other in response to thermal cycling of the article without fracturing the diamond substrate.

17. The method of claim 16 wherein the article includes an adhesive bond around the edges of the support which bond attaches the substrate and the support together; the support includes a well smaller than the substrate within which well the second fibers are disposed; the substrate covers the well and the first fibers extend into the well; and the substrate has a metal layer on its surface in which the first fibers are anchored.

18. The method of claim 17 including the step of operating the article such that temperature of the diamond substrate is 10°–50° C. lower than if the substrate were gallium arsenide.

* * * * *